United States Patent [19]

Müller et al.

[11] 4,018,942  
[45] Apr. 19, 1977

[54] METHOD FOR THE MANUFACTURE OF A SUPERCONDUCTOR WITH A LAYER OF THE A-15 PHASE OF THE SYSTEM NB-AL OR NB-AL-GE

[75] Inventors: Alfred Müller; Arno Fink, both of Erlangen, Germany

[73] Assignee: Siemens Aktiengesellschaft, Munich, Germany

[22] Filed: Oct. 31, 1974

[21] Appl. No.: 519,676

[30] Foreign Application Priority Data

Nov. 2, 1973  Germany .................... 2355008

[52] U.S. Cl. .................... 427/62; 29/599; 118/405; 148/6.3; 148/20.3; 148/133; 427/380; 427/383 D; 427/436

[51] Int. Cl.² .................... B05D 5/12; C21D 1/00; C22F 1/18

[58] Field of Search ............... 29/194, 599; 427/62, 427/380, 383, 436, 431; 148/133, 127, 31.5, 34, 6.11, 20.3, 6.3; 118/65, 405, 620; 335/216; 338/32 S

[56] References Cited

UNITED STATES PATENTS

| | | | |
|---|---|---|---|
| 2,216,519 | 10/1940 | Quarnstrom | 118/620 X |
| 3,346,467 | 10/1967 | Allen | 29/599 X |
| 3,694,274 | 9/1972 | Giorgi et al. | 148/32 |
| 3,765,930 | 10/1973 | Miyano | 118/405 |

FOREIGN PATENTS OR APPLICATIONS 2,136,868  12/1972  France ................... 148/133

OTHER PUBLICATIONS

Journal Appl. Physics, vol. 43, 1972, pp. 2407–2412.  
Metallurgical Transactions, vol. 3, May 1972, pp. 1177–1181.  
Zeitschrift Fur Naturforschung, 25a, 1970, pp. 1659–1669.  
Constitution of Binary Alloys, Second Supplement Shunk, 1969, pp. 18–20.

Primary Examiner—C. Lovell  
Attorney, Agent, or Firm—Kenyon & Kenyon Reilly Carr & Chapin

[57] ABSTRACT

The invention concerns a method for the manufacture of a superconductor with a layer of the A-15 phase of the system Nb—Al or Nb—Al—Ge. According to the invention, a niobium carrier is provided with a 0.5 to 5 $\mu$m thick layer consisting of $NbAl_3$ and Al or of $Nb(Al,Ge)_3$, respectively, by being placed in an aluminum melt which is saturated with niobium or niobium and germanium, respectively, and is heated to 800° to 1400° C, and the niobium carrier provided with this layer is then annealed in an inert atmosphere for 0.5 to 5 seconds at a temperature of 1700° to 1960° C.

28 Claims, 5 Drawing Figures

METHOD FOR THE MANUFACTURE OF A SUPERCONDUCTOR WITH A LAYER OF THE A-15 PHASE OF THE SYSTEM NB-AL OR NB-AL-GE

BACKGROUND OF THE INVENTION

1. Field of the Invention

The invention concerns a method for the manufacture of a superconductor with a layer of the A-15 phase of the system Nb—Al or Nb—Al—Ge, respectively, as well as apparatus for carrying out this method.

2. Description of the Prior Art

The A-15 phases of the systems Nb—Al and Nb—Al—Ge become superconducting at relatively high temperatures and lose this state only in very strong magnetic fields. In the system Nb—Al the A-15 phase has the composition $Nb_3Al$ or a composition which deviates only slightly therefrom. For $Nb_3Al$, the maximum transition temperatures of $T_c = 18.8°$ K as well as upper critical magnetic fields $B_{c2}$ of approximately 30 Tesla at 4.2° K have been given. For the A-15 phase of the system Nb—Al—Ge with a niobium content of about 75 atomic precent in the range of compositions of about $Nb_3(Al_{1-x}Ge_x)$ with $0 < x \leq 0.25$, maximum transition temperatures of $T_c = 20.7°$ K and upper critical magnetic fields $B_{c2}$ of about 40 Tesla at 4.2° K have been reported (see *Zeitschrift fuer Naturforschung 25a* (1970), pages 1659 to 1669). These properties of the A-15 phases of the systems Nb—Al and Nb—Al—Ge are not exceeded by any superconductor that has become known to date. The A-15 phases mentioned are therefore of great technical interest, for instance, for application in superconducting magnet coils.

However, the technical application of these materials has not been successful heretofore because of various obstacles. On the one hand, the critical current densities reached so far are relatively low. Thus, melted or powder-metallurgically prepared samples of the A-15 phases mentioned, for instance, have critical current densities $j_c$ of only about $10^3$ amps/cm$^2$ in a magnetic field of 5 Tesla and at a temperature of 4.2° K. Only by three methods has it been possible to date to produce superconducting layers with values of the critical current density, which are of technical interest, of $10^4$ amps/cm$^2$ or more. This includes two methods for the manufacture of superconductors with layers of the A-15 phase of Nb—Al—Ge and a method for the manufacture of a superconductor with a layer of the A-15 phase of Nb—Al. In the two first-mentioned methods, an Nb—Al—Ge layer is in each case applied to a carrier by cathode sputtering or by condensation in a high vacuum (see *J. Vac. Sci.Technol.* 7 (1970), page 127 ff. and *J. Appl. Phys.* 43 (1972), page 2407 ff.). In the last-mentioned method (Metallurgical Transactions 3, (1972), pages 1177 to 1181), an aluminized niobium foil having an aluminum diffusion seam is annealed for 8 to 15 seconds at a temperature above 1870° C, to prepare a superconductor with an $Nb_3Al$ layer. The aluminum was applied here to the niobium foil by melting an aluminum wire over the foil or by vapor deposition or by electrolytic precipitation from a hot aluminum salt bath of about 300° to 500° C. To form the aluminum diffusion seam, the coated foil was heated to a temperature of between 800° and 900° C. Although the methods mentioned furnish A-15 layers with relatively high critical current densities, they do not yet appear to be suitable for the manufacture of technically usable superconductors with such layers. First, each of these methods requires considerable apparatus means, and in addition it is also most doubtful whether the methods, by which up to now only short wire samples have been prepared, can be modified for making long superconducting wires or ribbons, such as are required for winding superconducting coils.

A further difficulty, which so far has been in the way of a technical application of the A-15 phases mentioned, is that these phases are very brittle and can be deformed elastically only to a slight degree. In technically usable superconductors, therefore, the A-15 layers must be only a few $\mu$m thick and should lie as close to the neutral fiber of the conductor as possible. With the prior art expensive methods, the manufacture of long conductors with such thin layers would seem to present considerable difficulties. Although methods are known for manufacturing superconductors with layers of A-15 phases of other systems, particularly with layers of $Nb_3Sn$ and $V_3Ga$, which fulfill these requirements, such as the deposition of $Nb_3Sn$ on a suitable carrier from the gaseous phase or the diffusion of tin or gallium into niobium or vanadium wires, respectively, from copper-tin or copper-gallium sheaths which surround these wires, it has not been possible so far, to apply either method in a satisfactory manner for the manufacture of superconductors with $Nb_3Al$ or $Nb_3(Al,Ge)$ layers.

It is an object of the invention to make possible the manufacture of superconductors with a layer of the A-15 phase of the system Nb—Al or Nb—Al—Ge as simply as possible, where at the same time the highest possible transition temperatures and critical current densities which are usable for technical applications are to be achieved. In particular, the continuous manufacture of long wires or ribbons with thin layers of the A-15 phases mentioned should also be possible.

SUMMARY OF THE INVENTION

According to the invention, this problem is solved by providing a niobium carrier with a 0.5 to 5 $\mu$m thick layer consisting of $NbAl_3$ and Al or of $Nb(Al,Ge)_3$, respectively, by placing it in an aluminum melt which is saturated with niobium or niobium and germanium, respectively, and is heated to 800° to 1400° C, and by then annealing the niobium carrier provided with this layer in an inert atmosphere for 0.5 to 5 seconds at a temperature of 1700° to 1960° C.

The method according to the invention therefore consists essentially of two steps, namely, first, the preparation of a fast-adhering layer containing niobium and aluminum or niobium, aluminum and germanium on the surface of the niobium carrier which is placed in the aluminum or aluminum-germanium melt containing niobium, heated to 800° to 1400° C, and secondly, the formation of the A-15 phase of the system Nb—Al or Nb—Al—Ge by annealing the coated niobium carrier at a temperature of 1700° to 1960° C. Because, as already mentioned, the A-15 phase of the system Nb—Al has approximately the composition $Nb_3Al$ and the range of the system Nb—Al—Ge favorable for high transition temperatures includes the compositions of approximately $Nb_3(Al_{1-x}G_x)$ with $0 < x \leq 0.25$, the total range in which the method according to the invention is applicable, extends practically to A-15 phases of the compositions $Nb_3(Al_{1-x}Ge_x)$ with $0 \leq x \leq 0.25$.

DESCRIPTION OF THE INVENTION

Figure 1:
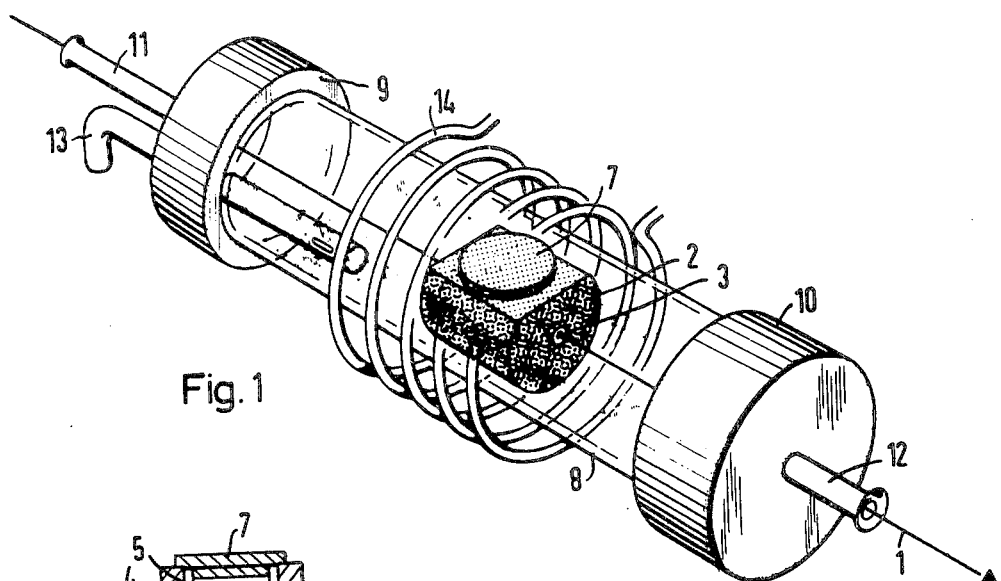
FIG. 1 shows a device to carry out the process in which a wire shaped niobium carrier is immersed in a melt.

For the first process step it is particularly important that the aluminum melt be saturated with niobium or niobium and germanium. If a niobium carrier is placed in an aluminum melt heated to the appropriate temperature, an uneven, closed layer is formed at the surface of the carrier, which contains crysallites of the composition $NbAl_3$. If the carrier is then removed from the melt, aluminum adheres additionally to the $NbAl_3$ formed, so that the layer formed consists overall of $NbAl_3$ and Al. If this coating were carried out in a pure aluminum bath, the melt would be enriched with niobium in the course of time, because part of the $NbAl_3$ does not remained fixed at the carrier, but is absorbed by the melt. Because of this change in the composition of the melt bath, uniform coating would no longer be assured and in particular, the thickness of the layer formed would change greatly along the wire when coating a niobium wire only 80 m long passing through the melt, as experiments have shown. An increase of the mean effective aluminum layer thickness from initially 1.2 $\mu$m to 8.4 $\mu$m is observed, for instance, in such an 80-m long niobium wire of 0.2 mm diameter with a temperature of the melt of 1400° C. The niobium content of the melt whose volume was about 3 ml. increased to 2 atomic percent during the passage of the wire. "Mean effective aluminum layer thickness" is understood here to mean the calculated thickness of a layer of pure aluminum which corresponds to the aluminum content of the actually grown layer of $NbAl_3$ and Al. As experiments have shown, not only the niobium content of the melt, but also the ratio of the germanium to the aluminum in the melt changes during the coating from an aluminum-germanium melt, as the layer growing on the niobium carrier has an aluminum-germanium ratio different from that of the melt. This results again in a very uneven coating.

If, on the other hand, the aluminum melt is saturated with niobium or niobium and germanium, corresponding to the method in accordance with the invention, the composition of the melt remains constant during the coating. In the course of the coating, only solid phases of $NbAl_3$ or $Nb(Al,Ge)_3$ and Ge form in a melt, while the composition of the liquid phase remains unchanged, It is the constant composition of the liquid phase, in addition to the constant temperature of the melt, that is the condition for the fact that also longer niobium carriers can be coated with layers of uniform thickness. The amounts of niobium or niobium and germanium, respectively, are, of course dependent on the respective temperature of the melt. At a temperature of 800° C, for instance, the amount of niobium required for saturation of an aluminum melt is about 2 atomic percent, at a temperature of 1000° C about 4 atomic percent, and at a temperature of 1400° C, about 12 atomic percent of niobium.

In the temperature range of the melt from 800 to 1400° C, which is to be used in the method according to the invention it is assured that the formation of the desired layers of $NbAl_3$ and Al or $Nb(Al,Ge)_3$, respectively, with a thickness of 0.5 to 5 $\mu$m takes place fast enough to make possible the coating of the niobium carrier also in a technically automated continuous process. The reaction times required are between 0.1 and 4 seconds, depending on the layer thickness and the temperature in each case. At melt temperatures below 800° C the formation of the layers would take place too slowly for technical applications and at temperatures above 1400° C so fast that it could hardly be controlled. From the layers formed in the coating with a layer thickness of between 0.5 and 5 $\mu$m, one finally obtains in the subsequent second process step, A-15 layers with a thickness of between about 1 and 10 $\mu$m, i.e., sufficiently thin and flexible layers.

As mentioned above, this second process step consists of annealing the coated niobium carrier in an inert atmosphere for 0.5 to 5 seconds at a temperature of 1700° to 1960° C. An inert atmosphere is understood here to be a non-oxidizing and non-nitriding atmosphere, e.g., vacuum or preferably, a rare gas. In the temperature range of 1700° to 1960° C provided for the annealing temperature, the layer applied in the first process step on the niobium carrier melts completely. The melted film produced then absorbs niobium from the substrate. Subsequently, the A-15 phase is then formed, in addition to other intermetallic phases of the corresponding systems. In the temperature range between range between 1850° and 1960° C the A-15 phase is generated by crystallization of the melted film; in the temperature range between 1700° and 1850° by a solid-phase reaction, for instance, between niobium and the initially formed $\alpha$-phase of the composition $Nb_2Al$. The formation of an $Nb_3Al$ layer would not be possible at temperatures above 1960° C, as the temperature of the pertitectic decomposition of this layer is just 1960° C. At temperatures below 1700° C no sufficient layer thickness of A-15 phase is obtained even with relatively long reaction times. The superconductive layers formed at temperatures below 1700° C have, furthermore, relatively low transition temperatures. The annealing times of 0.5 to 5 seconds are tuned to the already mentioned layer thicknesses of the A-15 phase of about 1 to 10 $\mu$m. With shorter annealing times, the attainable layer thicknesses are as a rule too small, and with longer annealing times, aluminum diffuses much too heavily from the $Nb_3Al$ layer formed into the niobium carrier material. Similar conditions as they were explained for the formation of the A-15 phase of the system Nb-Al also prevail in connection with the reaction conditions for the formation of the A-15 phase of the system Nb-Al-Ge.

Particularly high transition temperatures and critical current densities can be obtained in the manufacture of a superconductor with a layer of the A-15 phase of the system Nb—Al, if the niobium carrier is placed in an aluminum melt saturated with niobium, thereby coating the carrier with a layer consisting of $NbAl_3$ and Al, the aluminum content of this layer corresponds to an average effective aluminum layer thickness of 1 to 2

μm, and the niobium carrier coated in this manner is then annealed for 1 to 3 seconds in an inert atmosphere at a temperature of 1700° to 1900° C It is even more advantageous here to anneal the coated niobium carrier at a temperature of 1870° to 1900° C, because the A-15 layer crystallizes out of the melt in this temperature range and has particularly favorable critical values. At temperatures above 1900° C the already mentioned diffusion of aluminum into the niobium carrier begins, which results in lower critical values of the remaining A-15 layer.

It is particularly advantageous for attaining the average effective aluminum layer thickness mentioned of 1 to 2 μm to place the niobium carrier in the niobium-saturated aluminum melt for 0.1 to 5 seconds for coating, and that this melt is heated to a temperature of 950° to 1100° C and that it contains about 3 to 5 atomic percent of niobium, depending on the temperature.

To prepare a superconductor with a layer of the A-15 phase of the system Nb—Al—Ge, it has been found to be particularly advantageous to place the niobium carrier in a melt of the composition $Al_{69}Ge_{30}Nb_1$, heated to about 850° C, for forming the $Nb(Al,Ge)_3$ layer. This germanium- and niobium-saturated melt retains its composition at the temperature of about 850° C also in extended coating. It is particularly advantageous here, for obtaining high transition temperatures and high critical current densities, to place the niobium carrier in the melt for 0.5 to 1.5 seconds for forming an $Nb(Al,Ge)_3$ layer 1 to 2 μm thick and to anneal the coated niobium carrier for about 0.5 to 3 seconds in an inert atmosphere at a temperature of 1830° to 1870° C.

A further increase of the critical current densities of layers of the A-15 phase of the system Nb—Al and the system Nb—Al—Ge can be obtained by admixing to the inert atmosphere during the annealing a gas which can decompose or become reactive at the annealing temperature and which contains at least one of the elements carbon, boron or silicon. Evidently, these elements are incorporated in the A-15 layer during the annealing, which in turn results in an increase of the critical current density. It is particularly advantageous for avoiding excessive evaporation of aluminum, if a rare gas, preferably argon, and not a vacuum, serves as the inert atmosphere. To such a rare gas can then advantageously be admixed up to about 4% by volume of methane or up to about 0.3% by volume of diborane.

Independently of the incorporation of the elements named into the A-15 layer formed, an increase of the transition temperature and the critcial current density can be obtained by heat-treating the coated and annealed niobium carrier further for at least 10 hours in an inert atmosphere at a temperature of between 500° and 1000° C.

As already mentioned, the advantages of the method according to the invention show up particularly in the manufacture of long, wire- or ribbon-shaped niobium carriers with a surface layer of the respective A-15 phases. The wire- or ribbon-shaped niobium carrier can advantageously be pulled continuously through the melt and an annealing device. Apparatus particularly suitable for generating an A-15 layer on such a wire- or ribbon-shaped niobium carrier has been found which consists essentially of a metal container which is provided with passage openings for the niobium carrier and a melting crucible likewise provided with passage openings; a further metal elements provided with a passage opening; one tube each for enclosing the metal container and the metal element, respectively, which can be supplied with gas; and a high-frequency heating coil each, enclosing these tubes, for heating the metal container and the metal element, respectively.

Figure 2:
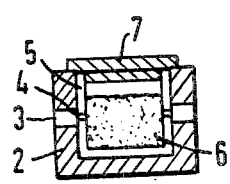
FIG. 2 shows a melting crucible used in the device shown in FIG. 1.
Figure 3:
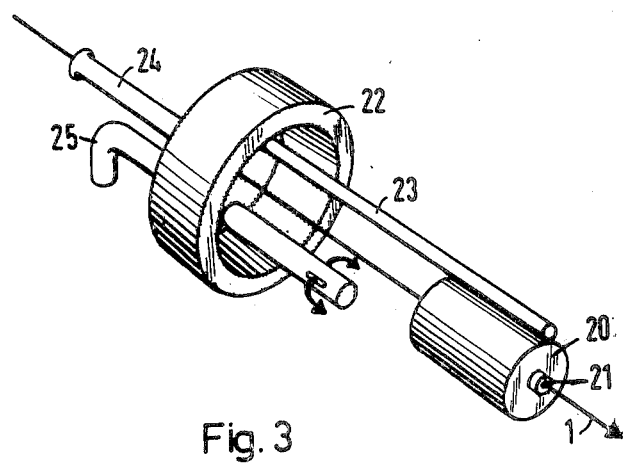
FIG. 3 shows a subsection of the device of FIG. 1 wherein the annealing step of the process is carried out.

The device shown in FIGS. 1 to 3 is advantageously suited for the continuous manufacture of wire-shaped or also ribbon-shaped conductors by the method according to the invention. FIG. 1 shows that part of the apparatus, in which the wire-shaped niobium carrier is immersed in the niobium or niobium and germanium-saturated aluminum melt and is provided with the layer consisting of $NbAl_3$ and Al or $Nb(Al,Ge)_3$, respectively. In FIG. 2, the melting crucible used in the device according to FIG. 1 is shown in further detail in cross section. FIG. 3 shows that partial section of the device, in which the niobium carrier, coated with the layer mentioned, is annealed at a temperature of 1700° to 1960° C.

For coating by means of the device shown in FIG. 1, a wire-shaped niobium carrier 1 is pulled through a metal container 2, which consists, for instance, of molybdenum and contains passage openings 3 for this purpose. Inside this metal container there is a melting crucible 5 of highly heat-resistant cermaic, which is likewise provided with passage openings 4 and in turn contains the niobium or niobium- and germanium-saturated aluminum melt 6. For a diameter of the niobium carrier 1 to be coated of about 0.2 mm diameter, the openings 4 may have a diameter of up to about 2 mm. Due to its surface tension, the melt 6 cannot flow then from the melting crucible 5 through these openings. The lid 7 serves for closing the metal container 2 after the material to be melted is in place. The metal container 2 charged wih the material to be melted is placed in a tube 8, e.g. a quartz tube which can be closed at both ends by caps 9 and 10 which may consist, for instance, of brass and can be cooled, for instance, with water. The caps 9 and 10 are provided with tubular feedthroughs 11 and 12 for the niobium carrier 1. Set into the cap 9 is further a nipple 13, through which the interior of the tube 8 can be supplied with gas, e.g., argon. A high-frequency heating coil 14, encloses the tube 8 on the outside and serves to heat the metal container 2 to the temperature required for the melt. The device has the advantage that the metal container 2 and the melting crucible 5 can be kept relatively small, so that with running speeds of the wire-shaped niobium carrier of several meters per minute, dwelling times of the carrier in the melt also of less than one second are easily attainable. The dimension of the metal container 2 in the pulling direction of the niobium carrier 1 may, for instance be a few centimeters.

For the subsequent annealing of the coated carrier a metal heating element 20, as shown in FIG. 3, may consist, for instance of niobium and which is provided with a tubular insert 21 of highly temperature-resistant ceramic. The coated niobium carrier 1 is pulled through this tubular insert for annealing. The metal element 20 is fastened to a brass cap 22 by means of a metal rod 23. The brass cap 22 is furthermore provided with a tubular feedthrough 24 for the niobium carrier and with a nipple 25. The complete annealing device is obtained if in the device shown in FIG. 1 the metal element 20 with the cap 22 is placed in or on the tube 8 in place of the cap and the metal container 2. The tube 8 can then again be supplied with gas by means of the nipple 25. A high-frequency heating coil 14 again serves for heating the metal element 20 to the required annealing temperature, as in FIG. 1.

Figure 4:
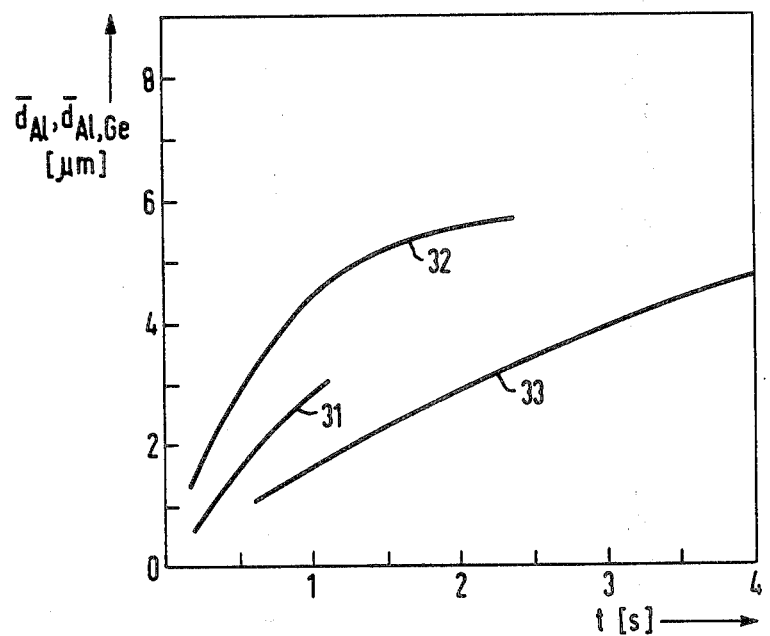
FIG. 4 shows, for different coating conditions, the mean effective aluminum and aluminum-germanium layer thicknesses attained in coating a niobium carrier as a function of the coating time.

The mean effective aluminum or aluminum-germanium layer thickness of the layer formed on the niobium carrier when the latter is placed in the melt depends on the temperature of the melt and on the dwelling time of the carrier in the melt as well as on the composition of the melt. In FIG. 4, this dependence is shown for three cases chosen as examples. along the ordinate of FIG. 4 the mean effective aluminum or aluminum-germanium layer thickness $\bar{d}_{Al}$ or $\bar{d}_{Al,Ge}$ is plotted in $\mu$m, and along the abscissa, the dwelling time of the niobium carrier in the melt, in seconds. Curve 31 shows the mean effective aluminum layer thickness obtained in a niobium-saturated aluminum melt kept at 1000° C, as a function of the dwelling time. Curve 32 shows the mean effective aluminum layer thickness obtained in a niobium-saturated aluminum melt heated to 1100° C as a function of the dwelling time. Curve 33 shows the mean effective aluminum-germanium layer thickness obtained in an $Al_{69}Ge_{30}Nb_1$ melt heated to 850° C as a function of the dwelling time. As can be seen from FIG. 4, the mean effective layer thicknesses increases with increasing melt temperature as well as with increasing dwelling times, particularly in the range of short dwelling times.

The manufacture of a superconductor by the method according to the invention will now be explained further with the aid of several examples. Examples 1 to 4 concern the manufacture of a conductor with a layer of the A-15 phase of the system Nb—Al, and Examples 5 to 7, the manufacture of a conductor with a layer of the A-15 phase of the system Nb—Al—Ge, and Examples 8 to 10, the manufacture of a conductor by the method according to the invention, in which during the annealing a gas containing at least one of the elements carbon, boron or silicon is admixed to the inert gas.

In all examples, a niobium wire with a diameter of about 0.2 mm is used as the niobium carrier. Furthermore, the apparatus shown in FIGS. 1 to 3 is used for coating and annealing the niobium carrier. The niobium wires, which are 100 m long and longer, and are led through the apparatus continuously.

EXAMPLE 1

Figure 5:
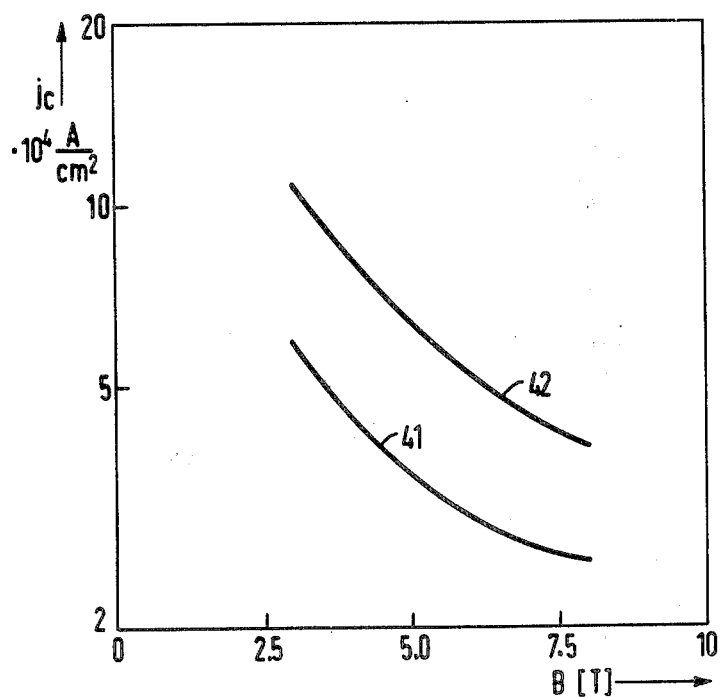
FIG. 5 shows the critical current density of a superconductor prepared by the method according to the invention as a function of the external magnetic field.

The niobium carrier is pulled, at a velocity of 3.16 m/min, through a melt of the composition $Al_{96}Nb_4$, heated to 1000° C. The dwelling time is about 0.4 second. During this dwelling time, a coating of $NbAl_3$ crystallites and elemental aluminum is produced about the core of niobium wire. The aluminum content of the sheath layer corresponds, over the entire length of the wire, to a mean effective aluminum layer thickness of 1.1 um. Subsequently the coated niobium wire is pulled through the niobium heater element 20, heated to a temperature of 1880° C, in argon with a pulling velocity of 1.15 m/min. The reaction time is here about 1.6 sec. During this reaction time, a 3.6 um thick sheath of A-15 phase of the system Nb—Al with a transition temperature of about 16.6° K is formed on the niobium carrier. The critical current density of this conductor, referred to the A-15 layer, is shown in FIG. 5 as a function of a magnetic field applied perpendicularly to the conductor. Along the ordinate of this figure, the critical current density $j_c$ is plotted in amps/cm², and along the abscissa, the magnetic flux density B in Teslas. The critical current density of the conductor prepared in accordance with the present example, after annealing, is represented by the curve 41. As Curve 41 shows, the critical current density is about 6 × 10⁴amps/cm² in magnetic field to 3 Tesla, about 3.5 × 10⁴amps/cm² in a magnetic field of 5 Tesla, and about 2.5 × 10⁴amps/cm² in a magnetic field of 8 Tesla. After the annealing, the superconductor is then further heat-treated for about 240 hours in argon at a temperature of about 750° C, whereby it is possible to achieve a considerable increase of the critical current density and also of the transition temperature. After the heat treatment, the transition temperature is 18.4° K, while the critical current density after the heat treatment shows the values represented by Curve 42 in FIG. 5. In an external magnetic filed of 5 Tesla, the critical current density after the heat treatment is about 6.5 × 10⁴ amps/cm². Curve 41 as well as also Curve 42 is measured at the temperature of liquid helium, 4.2° K.

EXAMPLE 2

A niobium carrier in wire form is pulled through a melt of the composition $Al_{96}Nb_4$, heated to 1000° C, its dwelling time in the melt being 0.5 sec. During this dwelling time a sheath consisting of $NbAl_3$ and aluminum with an effective aluminum layer thickness of 1.6 $\mu$m grows on the carrier. The niobium wire coated in this manner is then annealed for 1.6 seconds at a temperature of 1880° C. In this process, a 4-$\mu$m thick sheath of A-15 phase is formed with a transition temperature of 16.6° K and a critical current density of 2.2 × 10⁴amps/cm² in a magnetic field of 5 Tesla. Through a subsequent heat treating of about 240 hours in argon at a temperature of about 700° C, the transition temperature is increased to 18.5° K and the critical current density in a magnetic field of 5 Tesla to 4.6 × 10⁴amps/cm².

EXAMPLE 3

A niobium carrier in wire form is pulled through a melt of the composition $Al_{95}Nb_5$, heated to 1100° C, the dwelling time in the melt being 0.2 sec. During this dwelling time, a layer consisting of $NbAl_3$ and aluminum, which corresponds to a mean effective aluminum layer thickness of 1.6 $\mu$m, is formed on the carrier. The wire-shaped carrier coated in this manner is subsequently annealed for 2.1 sec at 1880° C. Here, a 4-$\mu$m thick layer of the A-15 phase is formed with a transition temperature of 16.6° K and a critical current density in a magnetic field of 5 Tesla of 2.8 × 10⁴amps/cm². Through a heat treatment lasting about 100 hours in argon at about 700° C the transition temperature of this conductor is increased to 18.5° K and the critical current density at 5 Tesla to 4.3 × 10⁴amps/cm².

EXAMPLE 4

A niobium carrier in wire form is pulled through a melt of the composition $Al_{96}Nb_4$, heated to 1000° C, its dwelling time in the melt being 0.6 sec. During this dwelling time, a layer consisting of $NbAl_3$ and aluminum, which corresponds to a mean effective aluminum layer thickness of 1.8 $\mu$m, is formed on the carrier. The carrier coated in this manner is annealed for 2.1 sec at a temperature of 1700° C. Here, a 3.5 $\mu$m thick layer of the A-15 phase is formed with a transition temperature of 16.6° K and a critical current density at 5 Tesla of 1.2 × 10²amps/cm². Through a subsequent heat treatment for about 240 hours in argon at about 700° C, the transition temperature is increased to 18.5° K and the critical current density at 5 Tesla to 2.2 × 10⁴ amps/cm². The wire is annealed in this example, as in the Examples 1 to 3, in argon.

EXAMPLE 5

A niobium carrier in wire form is pulled through a melt of the composition $Al_{69}Ge_{30}Nb_1$, heated to 850° C, at a velocity of 1.8 m/min. This velocity corresponds to a dwelling time of the wire in the melt of about 0.7 sec. During this dwelling time, a uniform, 1.5 μm thick sheath of $NbAl_{2.7}Ge_{0.3}$ is produced around the wire. Subsequently, the coated wire is annealed in argon at about 1830° C. For this purpose it is pulled through the niobium heating element 20 with a velocity of 1.2 m/min. This velocity corresponds to a reaction time of 1.5 sec. During this reaction time a coating is formed around the niobium core of the wire a 2.5 μm thick layer of the A-15 phase of the system Nb—Al—Ge with a composition of about $Nb_3 (Al_{0.9}, Ge_{0.1})$. On top of this layer there is a thin, 0.3-μm thick layer of the σ phase and top of this there is about a 0.2 μm thick zone which contains several phases, particularly the A-15 phase and the σ phase and a phase of the composition $Nb_5(Ge,Al)_3$. The superconductor properties of the 2.5 μm thick layer of the A-15 phase are not affected by the very thin layers of the other phases on top. The layer of the A-15 phase has a transition temperature of 17.3° K and a critical current density in a magnetic filed of 5 Tesla of 1.2 × 10⁴ amps/cm². As also in the other examples, the critical current density is measured at 4.2° K. Through an additional heat treatment lasting about 190 hours in argon at about 750° C, the transition temperature of the conductor is increased to 19.3° K and the critical current density at 5 Tesla to 1.8 × 10⁴ amps/cm².

EXAMPLE 6

A niobium carrier in wire form is pulled through a melt of the compostion $Al_{69}Ge_{30}Nb_1$, heated to 850° C, its dwelling time in the melt being about 0.7 sec. During this dwelling time a sheath of $NbAl_{2.7}Ge_{0.3}$, which corresponds to a mean effective aluminum-germanium layer thickness of 1.4 μm, is formed on the niobium carrier. The wire coated in this manner is then annealed for 0.6 sec. in argon at 1855° C. Here, a 2.8 μm thick layer of the A-15 phase of the system Nb—Al—Ge forms about the wire core with a transition temperature of 17.5° K and a critical current density at 5 Tesla of 1.7 × 10⁴ amps/cm². Through a heat treatment lasting about 190 hours at about 700° C in argon, the transition temperature of the conductor is increased to 19.3° K.

EXAMPLE 7

A niobium carrier in wire form is pulled through a melt of the composition $Al_{69}Ge_{30}Nb_1$, heated to 850° C, its dwelling time in the melt being about 0.7 sec. A sheath of $NbAl_{2.7}Ge_{0.3}$ which corresponds to a mean effective aluminum-germanium layer thickness of 1.4 μm, is formed on the niobium carrier. The carrier coated in this manner is annealed for 1 sec. in argon at 1855° C. Here, a 3.4 μm thick layer of the A-15 phase of the system Nb—Al—Ge with a transition temperature of 17.2° K and a critical current density at 5 Tesla of 3.0 × 10⁴ amps/cm² is produced. Through a subsequent heat treatment lasting about 190 hours in argon at about 700° C the transition temperature of this conductor is increased to 19.0° K and the critical current density at 5 Tesla to 4.2 × 10⁴ amps/cm².

EXAMPLE 8

A niobium carrier in wire form is pulled through a melt of the composition $Al_{96}Nb_4$, heated to 1000° C, its dwelling time in the melt being 0.4 sec. During this time a layer of $NbAl_3$ and aluminum, which corresponds to a mean effective aluminum layer thickness of 1.1 μm, is formed on the niobium carrier. Subsequently, this wire is annealed for 1.6 sec. at a temperature of 1880° C. The annealing is performed in argon to which 1.5% by volume of methane is admixed. In order to achieve an appropriate replacement of methane, the gas mixture is made to flow through the quartz tube, for instance, with a flow rate of 200 liter/hr; the metal heating element 20, shown in FIG. 3, is located in the quartz tube. During the reaction time of 1.6 sec., a 3.6 μm thick layer of the A-15 phase of the system Nb—Al is formed on the niobium carrier, carbon being incorporated in this layer as well as in the niobium carrier. The total carbon content of the carrier and the layer after the reaction is about 0.2 atomic percent. After annealing, the A-15 layer formed has a transition temperature of 16.5° K and a critical current density in a magnetic filed of 5 Tesla of 13 × 10⁴ amps/cm². Through a subsequent heat treatment of about 240 hours duration at 750° C in argon, the transition temperature is increased to 18.3° K and the critical current density at 5 Tesla to 26 × 10⁴ amps/cm².

EXAMPLE 9

A niobium carrier in wire form is pulled through a melt of the composition $Al_{96}Nb_4$, heated to 1000° C, its dwelling time in the melt being 0.4 sec. Here, a layer consisting of $NbAl_3$ and aluminum with a mean effective aluminum layer thickness of 1.1 μm is formed on the carrier. Various partial sections of the carrier coated in this manner are then annealed in argon at 1880° C for about one second each. In this process, different amount of methane are admixed to the argon. The respective amounts of methane as well as the transition temperature and the critical current density in a magnetic field of 5 Tesla of the layer, 2.6 μm thick, of the A-15 phase of the system Nb—Al formed during this reaction time are given in the following Table 1. Further shown in the Table are the transition temperatures and critical current densities at 5 Tesla, which are acheived through an additional heat treatment of about 100 hours duration of the resepctive conductors in argon at a temperature of about 700° C.

Table 1

| Addition of $CH_4$ in % by vol. | After annealing | | After heat treatment at 700° C | |
|---|---|---|---|---|
| | $T_c$ in ° K | $j_c$ in 10⁴ amps/cm² | $T_c$ in ° K | $J_c$ in 10⁴ amps/cm² |
| 0 | 16.3 | 2.8 | 18.3 | 5.4 |
| 0.1 | 16.3 | 3.5 | 18.3 | 6.0 |
| 0.3 | 16.3 | 4.9 | 18.2 | 7.6 |
| 0.8 | 16.3 | 6.4 | 18.0 | 10.5 |
| 1.9 | 16.3 | 9.0 | 18.1 | 17.9 |
| 3.0 | 16.3 | 10–16 | 18.0 | 14–28 |

As Table 1 shows, the critical current densities of the conductors produced can be increased substantially by admixing methane to the argon atmosphere during the annealing. A further increase is obtained by a subsequent heat treatment. The addition of methane should advantageously be not more than 4% by volume, as with larger additions, although very high critical current densities still occur, the niobium carrier becomes increasingly brittle due to carbide precipitation.

EXAMPLE 10

A niobium carrier in wire form is pulled through a melt of the composition $Al_{96}Nb_4$, heated to 1000° C, its dwelling time in the melt being 0.4 sec. A layer consisting of $NbAl_3$ and aluminum with a mean effective aluminum layer thickness of 1.1 $\mu m$ is formed on the carrier. Various partial sections of the carrier coated in this manner annealed in argon at a temperature of 1880° C for about one second each. Different amounts diborane ($B_2H_6$) are admixed here to the argon. The different admixtures as well as the transition temperatures and the critical current densities in a magnetic field of 5 Tesla of the 2.6 $\mu m$ thick layers of the A-15 phase of the system Nb—Al formed during the reaction time, as achieved by these admixtures, are given in the following Table 2. Further shown in the Table are the transition temperatures and the critical current densities attainable through a heat treatment of about 100 hours duration in argon at about 700° C, following the annealing.

Table 2

| Addition of $B_2H_6$ in % by vol. | After annealing | | After heat treatment at 700° C $T_c$ in ° K $j_c$ in $10^4$ amps/cm² | |
|---|---|---|---|---|
| | $T_c$ in ° K | $j_c$ in $10^4$ amps/cm² | $T_c$ | $j_c$ |
| 0. | 16.4 | 3.8 | 18.1 | 7.8 |
| 0.03 | 16.0 | 7.5 | 17.6 | 12.4 |
| 0.05 | 16.1 | 6.5 | 17.6 | 14.0 |
| 0.06 | 16.2 | 6.2 | 17.6 | 12.9 |
| 0.09 | 16.5 | 4.3 | 17.7 | 8.8 |
| 0.25 | 16.6 | 4.0 | 18.2 | 8.5 |

As seen in Table 2, substantial increases of the critical current density are obtained by admixing diborane to the argon during the annealing. Particularly high critical current densities are achieved with diborane additions between 0.03 and 0.06% by volume.

Similar improvements can be obtained by admixing silicon-containing gas, for instance, silanes.

The method according to the invention is suited, of course, also for coating niobium conductors in ribbon form, as it is for the coating of wires, with layers of the A-15 phase of the systems Nb—Al and Nb—Al—Ge. As due to the niobium or niobium and germanium saturation of the aluminum melts, the conditions for the coating of the niobium carrier remain unchanged over long periods of time, carriers also of very great length, e.g., several kilometers, can be coated continuously with the method according to the invention. The method according to the invention is also suited for coating niobium carriers of different shape, e.g., of sheets or cylinders, which can then advantageously be immersed in the melt for coating.

What is claimed is:

1. A method for the manufacture of a superconductor having a layer of the A-15 phase of the system Nb—Al comprising:
   a. coating a niobium carrier with a coat having a thickness between 0.5 and 5$\mu m$ by placing the carrier in an aluminum melt at a temperature between 800° and 1400° C, said aluminum melt containing sufficient niobium to saturate the aluminum melt therewith; and
   b. then immediately annealing the coated niobium carrier in an inert atmosphere for 0.5 to 5 seconds at a temperature of 1700°–1960° C to thereby form a layer of Nb—$Al_3$.

2. A method for the manufacture of a superconductor having a layer of the A-15 phase of the system Nb—Al—Ge comprising:
   a. coating a niobium carrier with a coat having a thickness between 0.5 and 5 $\mu m$ by placing the carrier in an aluminum melt at a temperature of between 800° and 1400° C, said aluminum melt containing sufficient niobium and germanium to saturate the aluminum melt therewith; and
   b. then immediately annealing the coated niobium carrier in an inert atmosphere for 0.5 to 5 seconds at a temperature of 1700°–1960° C to thereby from a layer of Nb(Al,Ge)$_3$.

3. The method of claim 1 wherein said layer is the carrier is placed in a niobium saturated aluminum melt to coat the carrier with a coating having an Al content corresponding to a mean effective aluminum layer thickness of 1 to 2 $\mu m$ and the niobium carrier so coated is annealed in an inert atmosphere for 1 to 3 seconds at a temperature of 1700° to 1900° C.

4. The method of claim 3 wherein the coated niobium carrier is annealed at a temperature of 1870° to 1900° C.

5. The method of claim 1 wherein the niobium carrier is placed in the niobium-saturated aluminum melt for 0.1 to 0.5 seconds with said melt heated to a temperature of 950° to 1100° C and said melt containing from 3 to 5 atomic percent of niobium, depending on temperature.

6. The method of claim 3 wherein the niobium carrier is placed in the niobium-saturated aluminum melt for 0.1 to 0.5 seconds with said melt heated to a temperature of 950° to 1100° C and said melt containing from 3 to 5 atomic percent of niobium, depending on temperature.

7. The method of claim 2 wherein said niobium carrier is placed in an aluminum melt which is saturated with niobium and germanium to coat the carrier with a 0.5 to 5 $\mu m$ thick layer of Nb(Al,Ge)$_3$, and the coated niobium carrier then annealed in an inert atmosphere for 0.5 to 5 seconds at a temperature of 1700° to 1960° C.

8. The method of claim 7 wherein said aluminum melt which is saturated with niobium and germanium is of the composition $Al_{69}Ge_{30}Nb_1$, heated to about 850° C., for forming the Nb(Al,Ge)$_3$ layer.

9. The method of claim 2 wherein the annealing step occurs for about 0.5 to 3 seconds in an inert atmosphere at a temperature of 1830° to 1870° C.

10. The method of claim 1 wherein a gas which contains at least one of the elements carbon, boron and silicon and which is one of decomposable and reactive at the annealing temperature is admixed during the annealing step to said inert atmosphere.

11. The method of claim 10 wherein said inert atmosphere is a rare gas, and up to about 4 percent by volume of methane is admixed to said rare gas.

12. The method of claim 11 wherein said inert atmosphere is argon.

13. The method of claim 10 wherein said inert atmosphere is a rare gas, and up to about 0.3 percent by volume of diborane is admixed to said rare gas.

14. The method of claim 13 wherein said inert atmosphere is argon.

15. The method of claim 1 further comprising the step of further heat-treating said coated and annealed niobium carrier for at least 10 hours in an inert atmosphere at a temperature of between 500° and 1000° C.

16. The method of claim 1 wherein said niobium carrier is a wire.

17. The method of claim 16 wherein said placing and annealing steps are preformed on a continuously moving carrier.

18. The method of claim 1 wherein said niobium carrier is of ribbon form.

19. The method of claim 18 wherein said placing and annealing steps are performed on a continuously moving carrier.

20. The method of claim 2 wherein a gas which contains at least one of the elements carbon, boron and silicon and which is one of decomposable and reactive at the annealing temperature is admixed during the annealing step to said inert atmosphere.

21. The method of claim 20 wherein said inert atmosphere is a rare gas, and up to about 4 percent by volume of methane is admixed to said rare gas.

22. The method of claim 21 wherein said inert atmosphere is argon.

23. The method of claim 20 wherein said inert atmosphere is a rare gas, and up to about 0.3 percent by volume of diborane is admixed to said rare gas.

24. The method of claim 23 wherein said inert atmosphere is argon.

25. The method of claim 2 further comprising the step of further heat-treating said coated and annealed niobium carrier for at least 10 hours in an inert atmosphere at a temperature of between 500° and 1000° C.

26. The method of claim 2 wherein said niobium carrier is a wire.

27. The method of claim 2 wherein said niobium carrier is of ribbon form.

28. The method of claim 27 wherein said placing and annealing steps are performed on a continuously moving carrier.

* * * * *